United States Patent [19]
Hughes et al.

[11] Patent Number: 5,315,101
[45] Date of Patent: May 24, 1994

[54] METHOD OF MANUFACTURING A LARGE AREA ACTIVE MATRIX ARRAY

[75] Inventors: John R. Hughes; Martin J. Powell, both of Horley, England

[73] Assignee: U.S. Philips Corporation, New York, N.Y.

[21] Appl. No.: 11,935

[22] Filed: Feb. 1, 1993

[30] Foreign Application Priority Data

Feb. 8, 1992 [GB] United Kingdom ............ 9202693

[51] Int. Cl.$^5$ .............................................. H01J 40/14
[52] U.S. Cl. .................................. 250/208.1; 257/444
[58] Field of Search ........................ 250/208.1, 214 R; 358/213.11, 213.22, 213.28; 258/443, 444, 448

[56] References Cited

U.S. PATENT DOCUMENTS

| | | |
|---|---|---|
| 4,832,457 | 5/1989 | Saitoh et al. . |
| 4,866,291 | 9/1989 | Shimada et al. ............... 250/208.1 |
| 5,070,236 | 12/1991 | Miyake ........................... 250/208.1 |
| 5,184,018 | 2/1993 | Conrads et al. . |

FOREIGN PATENT DOCUMENTS

| | | |
|---|---|---|
| 0440282 | 8/1991 | European Pat. Off. . |
| 0441521 | 8/1991 | European Pat. Off. . |
| 0523783 | 1/1993 | European Pat. Off. . |
| 63-183420 | 1/1987 | Japan . |
| 64-38727 | 8/1987 | Japan . |

*Primary Examiner*—David C. Nelms
*Assistant Examiner*—K. Shami
*Attorney, Agent, or Firm*—Robert J. Kraus

[57] ABSTRACT

A large area active matrix array (2) is manufactured by providing four substrates (1) each carrying a sub-array (21) having an active area (11) comprising a matrix of switching elements (30) and associated row and column conductors (41) and (42) for enabling addressing of individual switching elements (30). The row and column conductors (41) and (42) terminate in respective connecting leads (41a and 42a) extending beyond the active area (11). A portion (1a) of each substrate (1) and the connecting leads carried is removed so as to form a new substrate edge (1'a) adjacent each of two adjoining edges of the active area (11) and the substrates (1) are mounted onto a support (12) so that each new substrate edge is adjacent another new substrate edge (1'a) to form the large area array (2), thereby allowing the same pixel pitch to be maintained across the array (2). Each sub-array (2') may be fully tested before completion of the array (2) which should allow higher yields.

12 Claims, 8 Drawing Sheets

METHOD OF MANUFACTURING A LARGE AREA ACTIVE MATRIX ARRAY

BACKGROUND OF THE INVENTION

This invention relates to a method of manufacturing a large area active matrix array for a large area imaging or display device.

Active matrix display devices such as liquid crystal (LCD) displays and matrix addressed image sensors using thin film technology have many applications some of which may require an active matrix array of large area, for example a 20 cm (centimeter) by 20 cm or even a 40 cm by 40 cm array. Such large area arrays may be required where, for example, an image sensor is to be used in medical applications, for example as part of an X-ray detector, or in large document imaging for example in electronic copying or facsimile machines.

It is currently not technically feasible to manufacture such a large area active matrix array on a single substrate because even where machines are available to enable deposition and patterning of layers over such a large area, the possibility of defects occurring increases markedly with area and thus the likelihood of some areas of the array not functioning correctly is very high. The yield of correctly functioning arrays would therefore be extremely low.

JP-A-63-183420 describes an LCD display having a transparent first base plate carrying transparent scanning electrodes. A number of transparent second base plates are provided each carrying an array of pixel electrodes and a matrix of switching elements in the form of electrodes running along the length of the second base plate. The second base plates are bonded to a third base plate so as to be joined together in a direction perpendicular to the scanning electrodes. The liquid crystal is sandwiched between the first and second base plates. In the LCD device described in JP-A-63-183420 each of the second base plates extends across the entire width of the array and accordingly the manufacture of this device requires the deposition and patterning of the materials for forming the thin film diodes and pixel electrodes over an area which still has a width equal to that of the desired array. Thus, the problems of the low yields which are obtainable when depositing and patterning materials over a large area still remain.

SUMMARY OF THE INVENTION

According to one aspect of the present invention, there is provided a method of manufacturing a large area active matrix array for a large area imaging or display device, which method comprises providing four substrates each carrying an active area comprising a matrix of switching elements arranged in rows extending between first and second edges of the active area and columns extending between third and fourth edges of the active area and means for accessing individual switching elements comprising a respective row conductor connecting the switching elements of each row and terminating in connecting leads extending beyond the first and second edges of the active area and a respective column conductor connecting the switching elements of each column and terminating in connecting leads extending beyond the third and fourth edges of the active area, removing a portion of each substrate and the connecting leads carried thereby so as to form a new substrate edge adjacent each of two adjoining edges of the active area and mounting the substrates onto a support so that each new substrate edge is adjacent another new substrate edge to form the large area active matrix array.

In another aspect, the present invention provides a large area active matrix array for use in a large area imaging or display device, which array comprises a support on which are mounted four substrates each carrying an active area comprising a matrix of switching elements arranged in rows extending between first and second edges of the active area and columns extending between third and fourth edges of the active area and means for accessing individual switching elements comprising a respective row conductor connecting the switching elements of each row and terminating in connecting leads extending beyond the active area and a respective column conductor connecting the switching elements of each column and terminating in connecting leads extending beyond the active area, a portion of each substrate and the connecting leads carried thereby having been removed so as to define a substrate edge adjacent each of two adjoining edges of the active area and the substrates being mounted to the support so that the substrate edges adjacent the two adjoining edges of the active area are adjacent one another to provide a large area active matrix array having the same pitch as each matrix.

Thus, a large area active matrix array manufactured in accordance with the invention is made up of four separate sub-arrays each comprising a substrate carrying a respective active area and associated row and column conductors. Accordingly, before assembly of the large area array, each sub-array can be fully functional and can be tested to ensure that there are no faults. The removal of the portion of each substrate enables the substrates to be mounted on the support so that the pixel pitch of the active arrays is maintained across the completed large area active matrix array. In addition, as the present invention only requires the deposition and patterning of layers over an area which is one fourth of that of the finished active matrix array the low yield problems can be reduced.

The portions of the substrate may be removed using any suitable apparatus such as a diamond saw or a laser saw. If considered desirable the cut edges may then be polished or ground.

The substrates may be provided so that each array is identical and mounted to the support so that all of the substrates have the same orientation on the support. This means that only one mask set is required to produce each substrate so simplifying the manufacturing process. The substrates may alternatively be mounted to the support so that each substrate is rotated by 90° relative to the adjacent substrate. This has the advantage that there need be no conductors running along the new substrate edges so that the accuracy of the removal of the portions of the substrate need not be so great.

In another example, the substrates may be provided so that the arrays on two of the substrates are a mirror image of the arrays on the two other substrates and the substrates mounted to the support so that the remaining row conductor connecting leads extend along two sides of the support and the remaining column conductor connecting leads extend along the other two sides of the support. Although such an arrangement requires two mask sets, one being a mirror image of the other, it again has the advantage of avoiding having to have conductors running along the new substrate edges and in addition allows the remaining connecting leads of the row conductors and the column conductors to extend along respective sides of the large area array so facilitating the connection of drive circuitry to the large area array.

Each substrate may have an active area comprising a matrix of photosensitive elements each associated with a respective switching element. An electromagnetic radiation conversion layer may be provided on the array formed by the four substrates so enabling, for example, the formation of an X-ray detector.

BRIEF DESCRIPTION OF THE DRAWING

Embodiments of the invention will now be described, by way of example, with reference to the accompanying drawing figures, in which.

It should be understood that the Figures are merely schematic and are not drawn to scale. In particular certain dimensions such as the thickness of layers or regions may have been exaggerated whilst other dimensions may have been reduced. It should also be understood that the same reference numerals are used throughout the Figures to indicate the same or similar parts.

DESCRIPTION OF THE PREFERRED EMBODIMENTS

Figure 1:
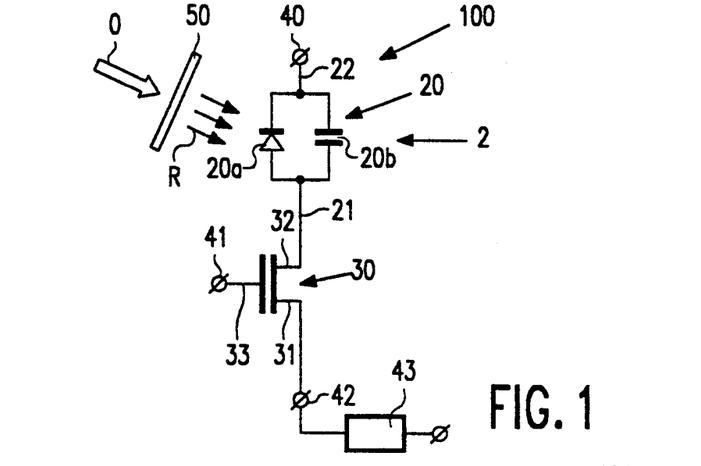
FIG. 1 illustrates, by way of a simplified schematic circuit, the principle of operation of an image detector incorporating a large area active matrix array in accordance with the invention.

Turning now to the drawings, FIG. 1 illustrates the basic operational principle of an image detector 100 incorporating a large area active matrix array 2 in accordance with the invention. In this example the large area active matrix array comprises a matrix array of photosensitive elements 20 and associated switching elements 30.

Where, as shown in FIG. 1, electromagnetic radiation to be detected lies in a range to which the photosensitive elements 20 are not sensitive, then the electromagnetic radiation 0 is first incident on an energy conversion layer 50 of the image detector 100 which converts the incident electromagnetic radiation 0 into outgoing electromagnetic radiation R with a second range of wavelengths detectable by the photosensitive elements 20. In this example, the incident electromagnetic radiation 0 comprises X-radiation and the outgoing electromagnetic radiation R comprises visible light. In such a case, the energy conversion layer 50 may be a phosphor layer, for example a layer of thallium-doped caesium iodide. Although other phosphors could be used, the use of thallium-doped caesium iodide has advantages in that the spectrum of the emitted electromagnetic radiation R peaks in the range of 400 to 700 nm (nanometers) which is the most responsive range of amorphous silicon photodiodes. In addition, caesium iodide has a columnar structure which provides a sort of light-guiding effect, so reducing scattering problems.

The outgoing electromagnetic radiation is incident on the photosensitive elements 20, in this example photosensitive diodes, of the matrix array 2. The array 2 is illustrated schematically in FIG. 1 by a single photosensitive element 20 which is shown as a diode 20a in parallel with a capacitor 20b which in this case represents the parasitic or self capacitance of the diode 20a but which may also include an additional capacitor to improve the dynamic range of the detector. The first electrode 21 of the photosensitive diode 20, represented by the cathode of diode 20a, is connected to the common line 40 as will be described below while the second electrode 22 of the photosensitive diode, represented by the anode of the diode 20a, is connected to the second electrode 32 of the associated switching element 30, in this example to the drain electrode of a thin-film transistor 30. The control or gate electrode 33 of the thin-film transistor 30 is connected to a row conductor 41 while the first or source electrode 31 of the thin-film transistor 30 is connected via a column conductor 42 to a charge sensitive readout amplifier 43 of a conventional type. A readout arrangement of the type described in EP-A-440282 could also be used.

Figure 2:
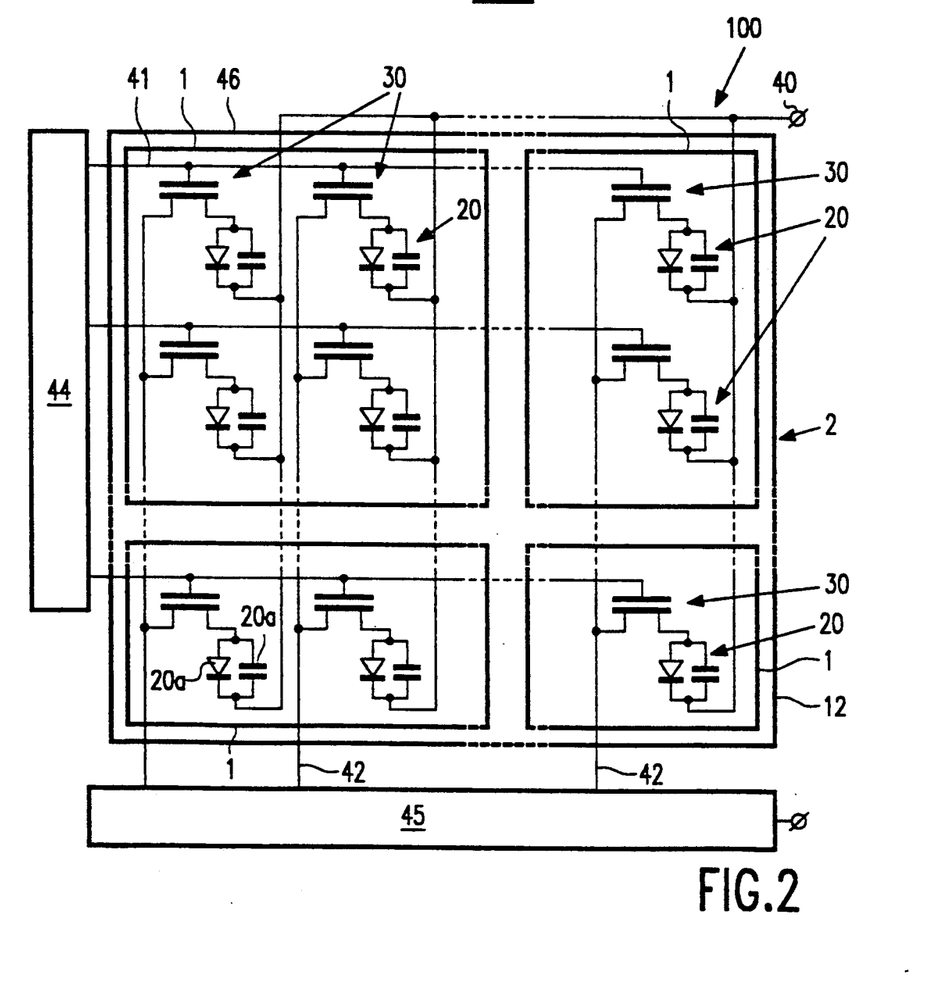
FIG. 2 is a schematic circuit layout of the array of photosensitive elements and associated switching elements of an image detector in accordance with the invention.

FIG. 2 illustrates schematically the circuit layout of an area of the large area active matrix array 2. In this example, the large area active matrix array 2 comprises a two dimensional array of photodiodes 20 with a pitch of typically 200 μm (micrometers) or less and an overall size of up to 400 by 400 mm to achieve the sort of resolution required where the image detector is to be used for detecting diagnostic X-ray images of areas of a human or animal body. Typically, the array may be a 2000×2000 array of pixels. For convenience only a portion of the array is shown in full in FIG. 2.

The thin-film transistor switching elements 30 are arranged in a matrix of 1-m rows and 1-n columns (only three rows and three columns are shown) with the gate of each transistor in a given row being connected to the same row conductor 41 of a row driver or decoder/addressing circuit 44 and the source of each transistor in a given column being connected to the same column conductor 42 of a column decoder/addressing circuit 45 including read out amplifiers as shown in FIG. 1. The solid line 46 indicates the extent of the electromagnetic radiation detecting area of the photodetector array 2.

In accordance with the invention and as will be explained in greater detail below with reference to FIGS. 5 to 8, the large area active matrix array 2 is manufactured by providing four substrates 1 each carrying an active area 11 comprising a matrix of switching elements 30 arranged in rows extending between first and second edges 11a of the active area 11 and columns extending between third and fourth edges 11b of the active area and means for accessing individual switching elements comprising a respective row conductor 41 connecting the switching elements 30 of each row and terminating in connecting leads 41a extending beyond the first and second edges 11a of the active area 11 and a respective column conductor 42 connecting the switch elements 30 of each column and terminating in connecting leads 42a extending beyond the third and fourth edges 11b of the active area 11, removing a portion 1a of each substrate 1 and the connecting leads carried thereby so as to form a new substrate edge 1'a (shown in dashed lines in FIG. 5) adjacent each of two adjoining edges of the active area 11 and mounting the substrates 1 onto a support so that each new substrate edge is adjacent another new substrate edge 1'a to form the large area array 2. This enables the same pixel pitch to be maintained across the entire large area active matrix array 2. Where the large area active matrix array 2 has an overall size of 400 by 400 mm then each substrate 1 will provide a sub-array 2' of 200 by 200 mm.

Figure 3:
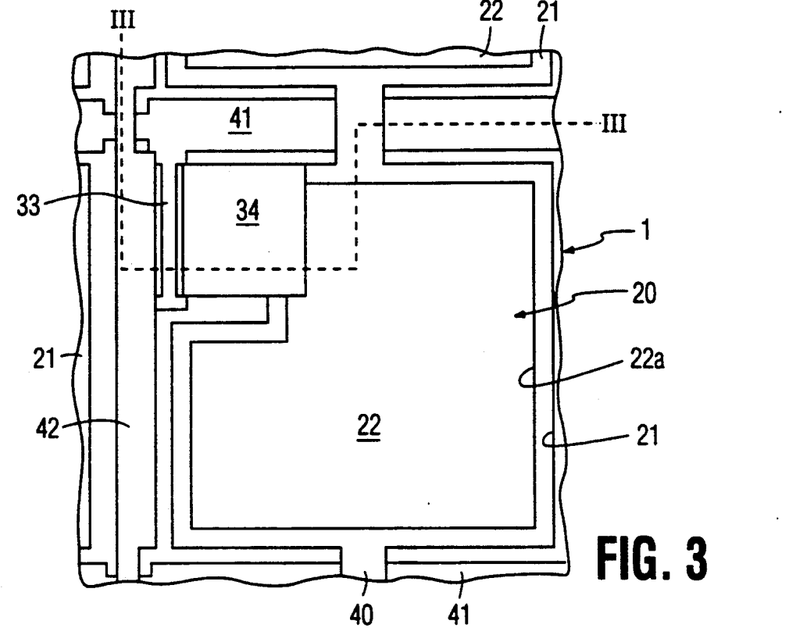
FIG. 3 is a schematic plan view of one pixel of an active area of a substrate but illustrating only the conductive levels to show the geometric relationship between the electrodes of the photosensitive elements, the electrodes of the switching elements and row and column conductors of the image detector.

FIG. 3 illustrates, by way of a schematic plan view of part of one substrate 1 to show the geometric layout and the relationship between the first and second electrodes 21 and 22 of a photosensitive element, in this case a photodiode, 20 and the electrodes of the associated switching element 30 which together form one pixel of the array and the associated row and column conductors 41 and 42. In the interests of simplicity, all other structural features apart from the substrate 1, are omitted from FIG. 3.

FIGS. 4A to 4G are cross-sectional views taken along the dashed line III—III in FIG. 3 of one substrate 1 and the layers carried thereby for illustrating one example of a method of forming a sub-array 2' consisting of an active area matrix of photodiodes 20 and switching elements 30 and row and column conductors 41 and 42 on a substrate 1 which is to be joined together with three other substrates 1 to form a large area active matrix array 2 in accordance with the invention.

The substrate 1 is an insulative substrate, generally a glass substrate.

Figure 4A:
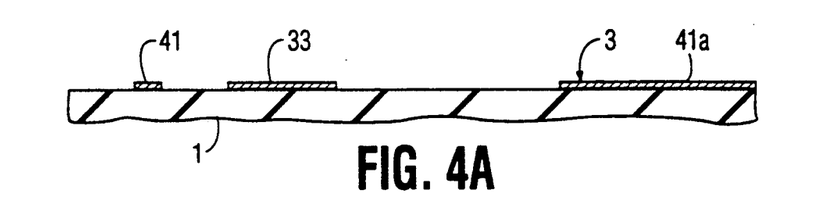
FIGS. 4A to 4G are cross-sectional views through part of a substrate and layers carried by the substrate for illustrating steps in a method for providing an active area, row and column conductors on a substrate.

In this example, as shown in FIG. 4A, a first metallisation level 3 is first provided on the substrate and patterned using a first mask (not shown) to define the control or gate electrodes 33 of the transistors 30, the gate lines or row conductors 41 and necessary connection areas 41a for enabling connections of the row conductors 41 to a higher metallisation level. The first metallisation level 3 may be provided by depositing a chrome layer.

Figure 4B:
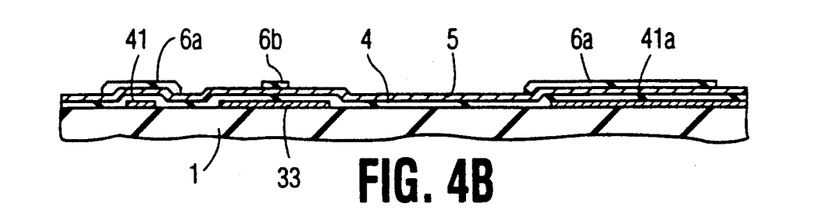

An insulating layer 4, generally a silicon dioxide or silicon nitride layer, is then deposited followed by an intrinsic semiconductor layer 5, parts of which will later form the conduction channel regions of the transistors 30, and optionally a protective layer 6. The protective layer 6 is an insulating layer generally a silicon nitride layer. The protective layer 6 is patterned using a second mask (not shown) and conventional photolithographic and etching techniques to leave, as shown in FIG. 4B, areas 6a over the row conductors 41 and the connection areas 41a so as to increase the thickness of overlying insulator, thereby reducing the parasitic capacitance, and the possibility of electrical shorts, between those regions of the first metallisation level 3 and subsequent overlying metallisation. A further area 6b of the protective layer is left over a central region of each transistor 30 so as to act as an etch stop. A doped, generally an n conductivity type, semiconductor layer 7 is then deposited followed by a second metallisation level or layer 8.

The doped semiconductor layer 7 may be formed of the same material as the intrinsic semiconductor layer 5, for example amorphous or polycrystalline silicon. The second metallisation layer 8 may be a chrome layer.

Figure 4C:
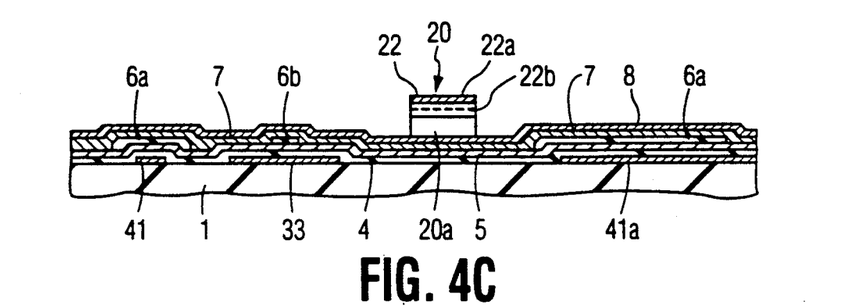

Further semiconductor layers are then deposited. Generally these will consist of an n conductivity type layer, an intrinsic type layer and a p conductivity type layer, followed by a transparent electrically conductive layer, for example an indium tin oxide (ITO) layer and a further chrome layer which acts to protect the ITO layer during subsequent processing. These layers are then sequentially patterned using a third single mask but different etching processes to define the photosensitive elements 20, such that each photosensitive element 20 consists (as shown in FIG. 4C) of a n-i-p (that is with the n conductivity type layer adjacent the first electrode 21) active device region 20a diode structure (shown unhatched in the Figures) on top of the second metallisation layer 8 followed by a transparent ITO electrode portion 22b and a chrome electrode portion 22a with the transparent and chrome electrode portions 22b and 22c together forming the second electrode 22 of the photosensitive element 20.

Figure 4D:
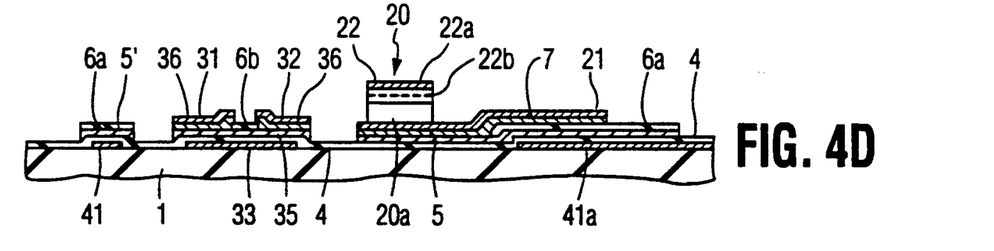
Figure 4E:
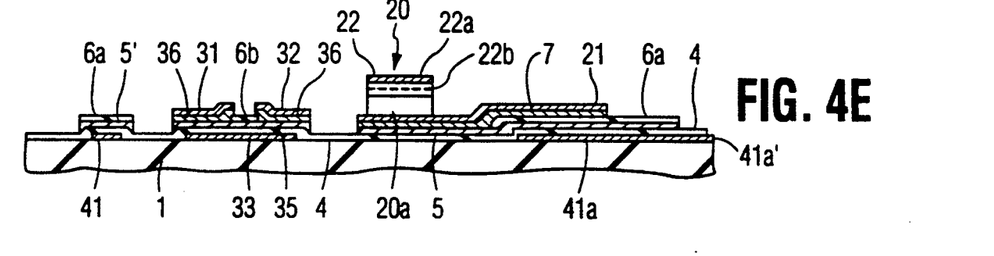
Figure 4F:
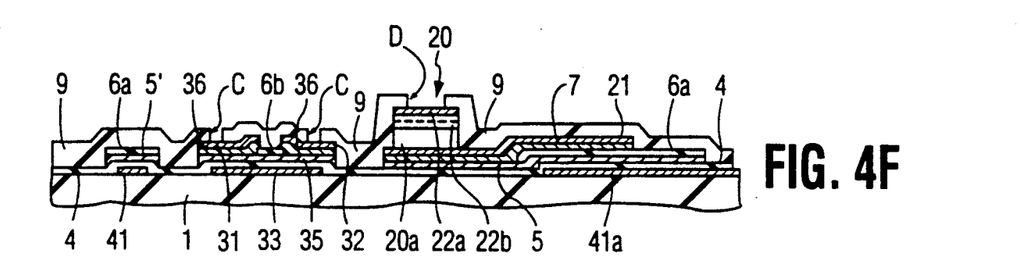

A fourth mask is then provided and the second metallisation level 8, doped semiconductor layer 7 and intrinsic semiconductor layer 5 are then sequentially patterned using appropriate photolithographic and etching techniques to define, as illustrated in FIG. 4D, the source and drain electrodes 31 and 32, source and drain n conductivity type contact regions 36 and an intrinsic conduction channel region 35 for each thin-film transistor 30 as well as the first electrode 21 of each photosensitive element 20. An area 5' of the layer 5 remains beneath the portion 6a of the protective layer. The source and drain contact regions 36 need not necessarily be provided in which case the layer 7 would be omitted. A fifth mask (not shown) is then used to enable the gate insulating layer 4 to be removed from part 41'a of the connection area 41a adjacent the periphery of the array (see FIG. 4E) to allow the final metallisation layer to contact the row conductors 41 as will be described below.

An insulating layer 9, formed of any suitable insulating material such as silicon nitride or polyimide, is then deposited and patterned using a sixth mask (not shown) and conventional techniques to define contact windows C (see FIG. 4F) for enabling contact by subsequent metallisation and to define an opening D over the photosensitive element 20.

Figure 4G:
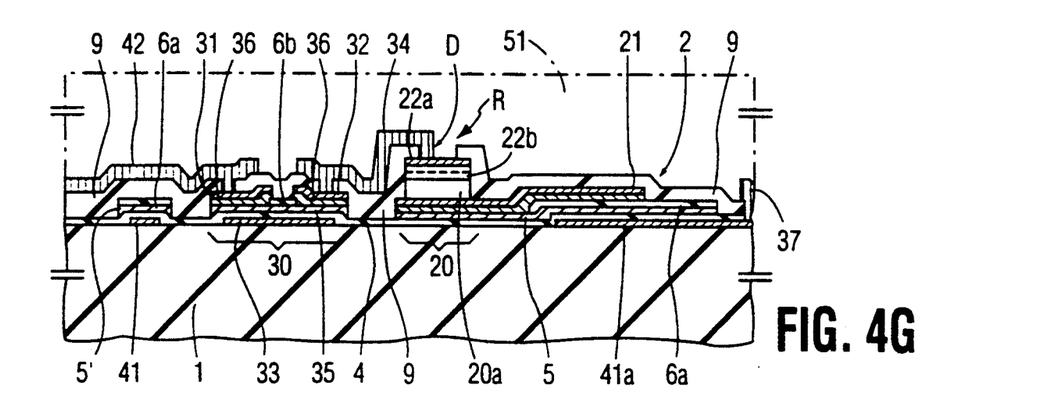

A final metallisation level, generally aluminium, is then deposited and patterned using a seventh mask (not shown) to define, as shown in FIG. 4G, the column conductors 42 contacting the respective columns of source electrodes 31, the electrical interconnections 34 between respective drain electrodes 32 and second electrodes 22 and the metallisation 37 contacting the connection area 41a at the edge of the array. During the patterning of the final metallisation level, part of the chrome electrode portion 22a is removed to leave an opening D' over the second electrode 22 of the photosensitive element 20 to enable electromagnetic radiation R to be incident on the photosensitive element 20.

Figure 5:
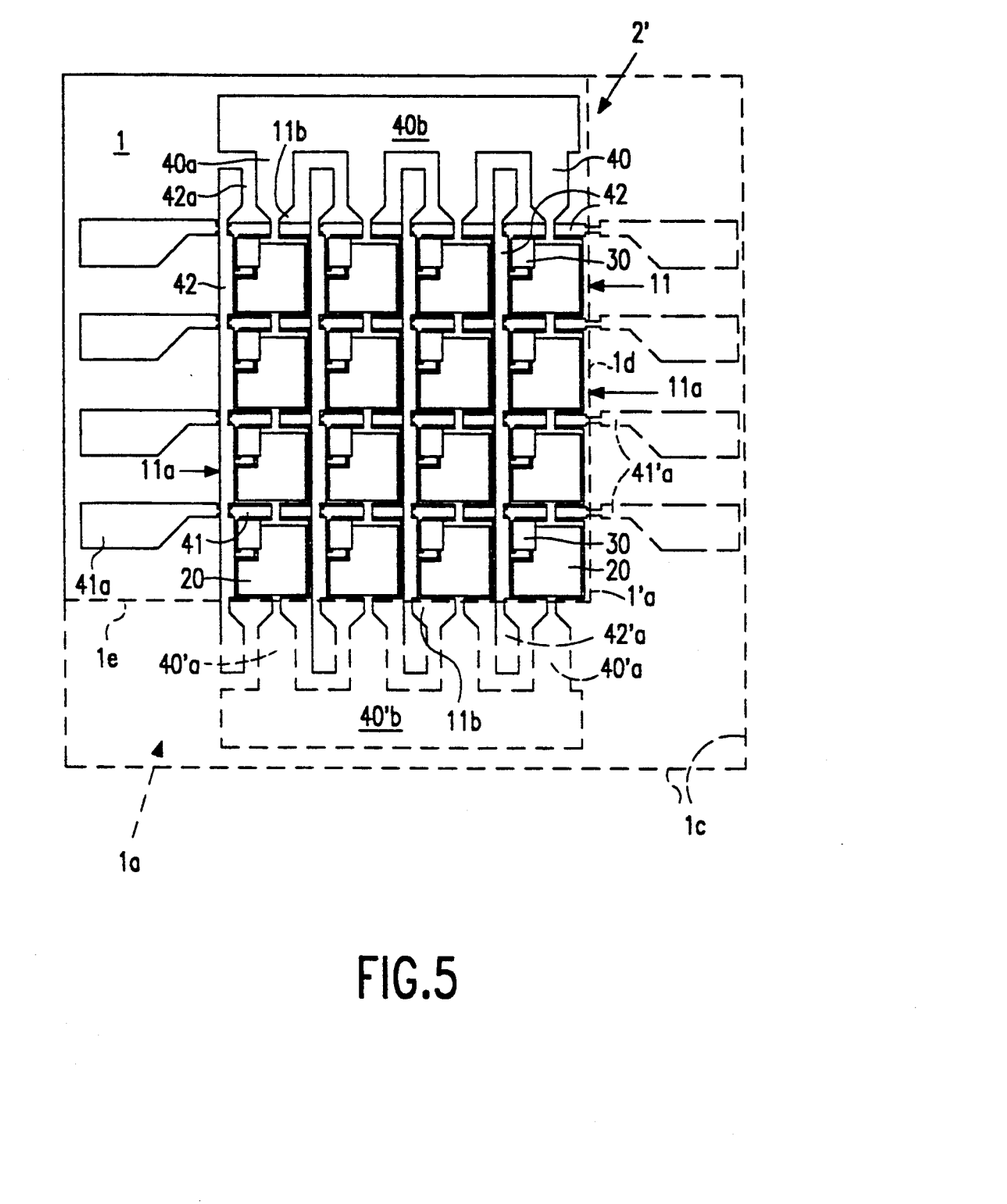
FIG. 5 is a schematic plan view showing the conductive layers only of an active area and associated row and column conductors provided on a substrate using the method illustrated in FIGS. 4A to 4G.

FIG. 5 illustrates schematically the layout of the conductive layers of the completed sub-array 2' on a substrate 1.

As can be seen clearly from FIG. 5, the sub-array 21 has an active area 11 consisting of a matrix of pixels (that is, in this case, photosensitive elements 20 and associated switching elements 30) the common line 40 and row and column conductors 41 and 42. Although in the interests of clarity and simplicity only a 4 by 4 pixel array is shown, it will of course be appreciated that in practice there will be many more pixels within the active area 11. Typically there may be 1000×1000 or more pixels per sub-array 21.

The reference numerals 11a,11b indicate the extent of the active area 11, which is in effect defined by the outermost conductors 41,42, in FIG. 5. The row and column conductors 41 and 42 have connecting leads 41a and 42a, respectively, which extend on the substrate 1 beyond the active area 11 to enable electrical connection to be made to the row and column conductors 41 and 42 to enable addressing of and readout of information from the individual pixels 20,30 in normal manner. As shown in FIG. 5, the row connecting leads 41a extend beyond the two opposed edges 11a of the active area 11 while the column connecting leads 42a extend beyond the remaining two opposed edges 11b of the rectangular, as shown square, active area 11. The common line 40 similarly has connecting leads 40a extending beyond the, in this example, edges 11b of the active area to common terminals 40b.

The sub-array 11 is thus functionally complete and may be subjected to conventional testing procedures to ensure that each pixel is correctly connected and functions in the required manner so allowing higher yields of correctly functioning large area active matrix arrays 2 to be obtained. This is particularly facilitated by the use of the method described above with reference to FIGS. 4A to 4G to manufacture the sub-array 2' because the connection between each photodiode 20 and the associated switching element 30 of a sub-array 2' manufactured using that method is at the top surface of the sub-array.

Once the testing of the sub-array 2' is complete, a portion 1a of the substrate, together with the connecting leads 40a',41a',42a' and common terminal 40'b carried thereby, is removed. This portion 41a of the substrate 1 and the associated connecting leads 40'a, 41'a, 42'a and common terminal 40'b are shown in phantom lines in FIG. 5. As is evident from FIG. 5, the portion 1a of the substrate 1 which is removed comprises a strip from each of two adjoining edges 1c of the substrate. Removal of the portion 1a leaves a new substrate edge 1d,1e adjacent two adjoining edges 11a,11b of the active area 11.

The portion 1a of the substrate 1 which is removed is dimensioned so that when each new substrate edge 1d,1e is positioned adjacent a similarly formed new substrate edge of another similar substrate the pixel pitch can be maintained across the substrates 1. Where the pixels have a 200 μm (micrometer) by 200 [m size and are separated from the neighbouring row and column conductors 41 and 42 by 10–20 μm this requires an accuracy of about 5 μm in the formation of the new substrate edges 1d,1e. The portion 1a of the substrate 1 may be removed by any suitable technique which can achieve this accuracy, such as a technique which involves cutting using any suitable apparatus such as a diamond saw or a laser saw and generally then polishing or, if desired, grinding and then polishing of the cut edges to achieve the precise location of the new substrate edge 1d,1e.

Figure 6:
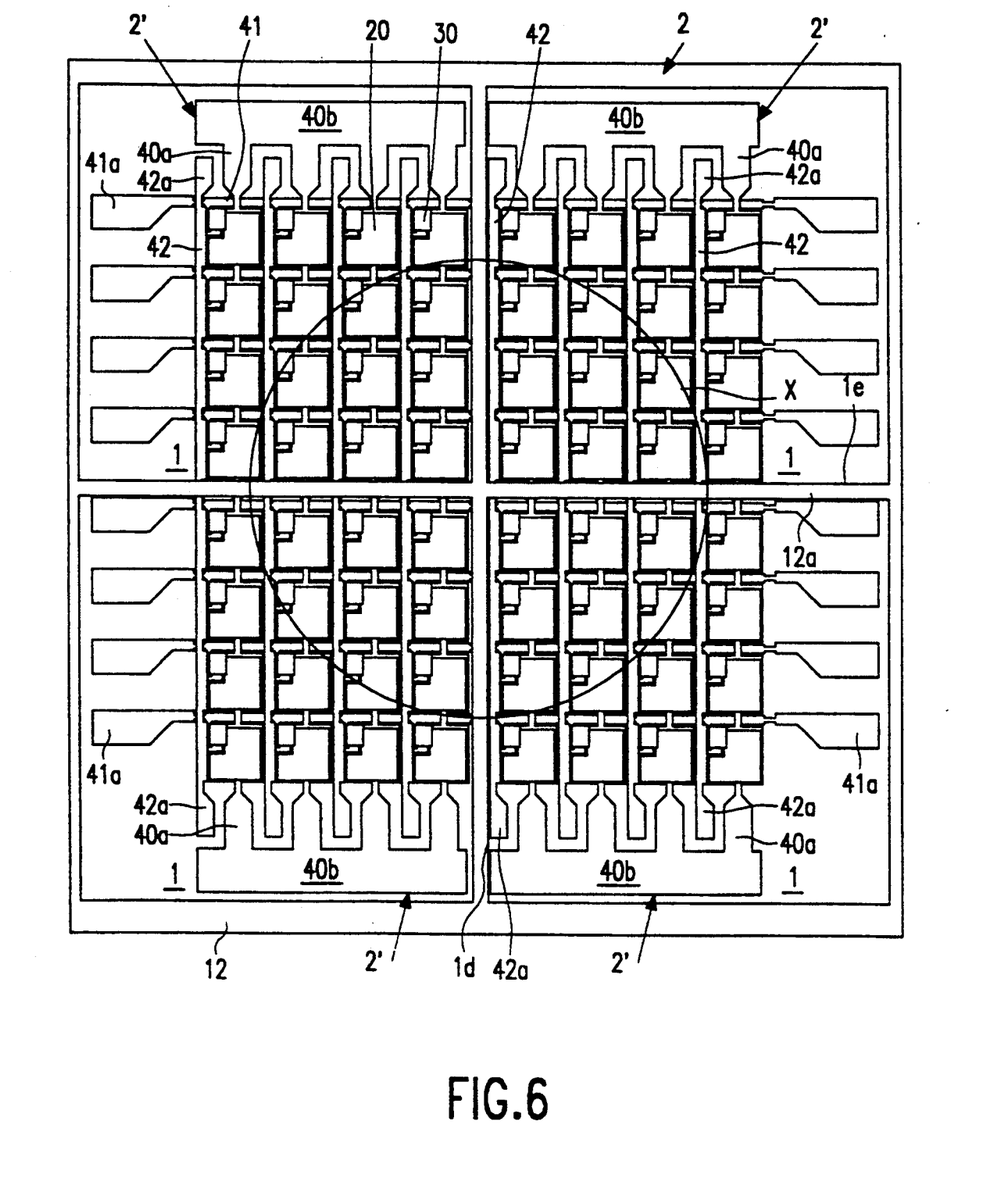
FIG. 6 is a schematic plan view showing one example of a large area active matrix array in accordance with the invention.
Figure 7:
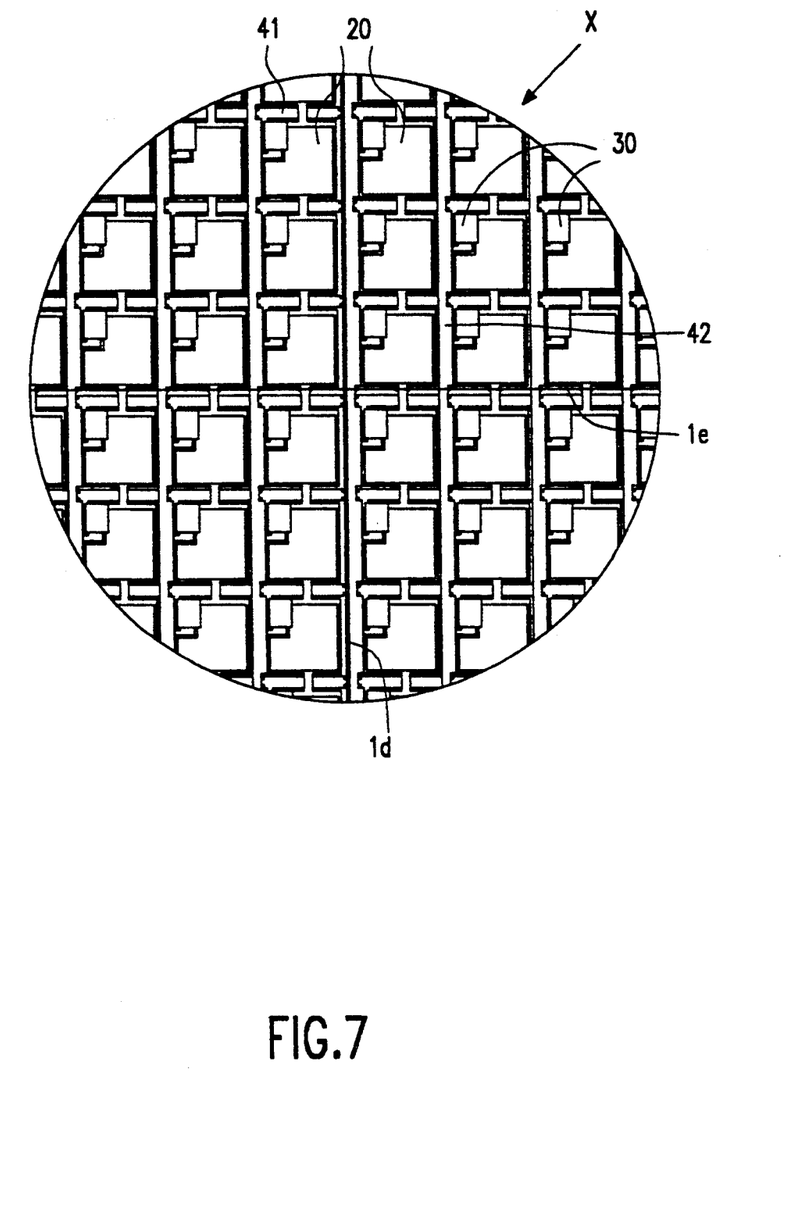
FIG. 7 is a enlarged schematic plan view of part of the large area active matrix array shown in FIG. 6.

In this example the substrate 1 is to be mounted on a support with another three identical substrates. All four substrates 1 are thus manufactured using the same mask sets and processes. After testing and removal of the substrate portions 1a, the substrates 1 are mounted, as shown in FIG. 6, onto a support 12 which is formed of a material having the same or similar thermal expansion characteristics as the substrates 1. Desirably, the support 1 is formed of the same glass as the substrates 1.

The surfaces of the support 12 and/or the substrates 1 to be joined together are coated with a suitable adhesive such as a commercially available epoxy resin or ceramic adhesive which allows for precise alignment of the substrates 1 on the support 12 before it sets. For example a UV curable adhesive could be used. The substrates 1 are generally aligned optically using a commercially available optical aligner which may effect alignment by way of special reference alignment marks provided on the substrates 1 or simply by using the crossing column and row indicators 41 and 42, for example, as reference markers.

As illustrated in FIG. 6, the four substrates 1 are aligned relative to one another so that a gap 12a is left between adjacent new substrate edges 1d,1e. In the interests of clarity the size of the gaps 12a is considerably enlarged in FIG. 6. However as indicated above and as clearly shown in FIG. 7 which represents an enlarged view of part X of the large area active matrix array 2 shown ringed in FIG. 6 with the gaps 12' shown approximately on the same scale as the pixels, the actual size of the gaps 12a is such that the pixel pitch, in particular the separation of the centroids of the pixels, is maintained across the joins and thus across the entire array 2.

With accurate cutting and correct alignment of the substrates so that the pixel pitch is maintained between the substrates 1 and a large area active matrix array 2 can be produced which provides images with no detectable joins.

Figure 8:
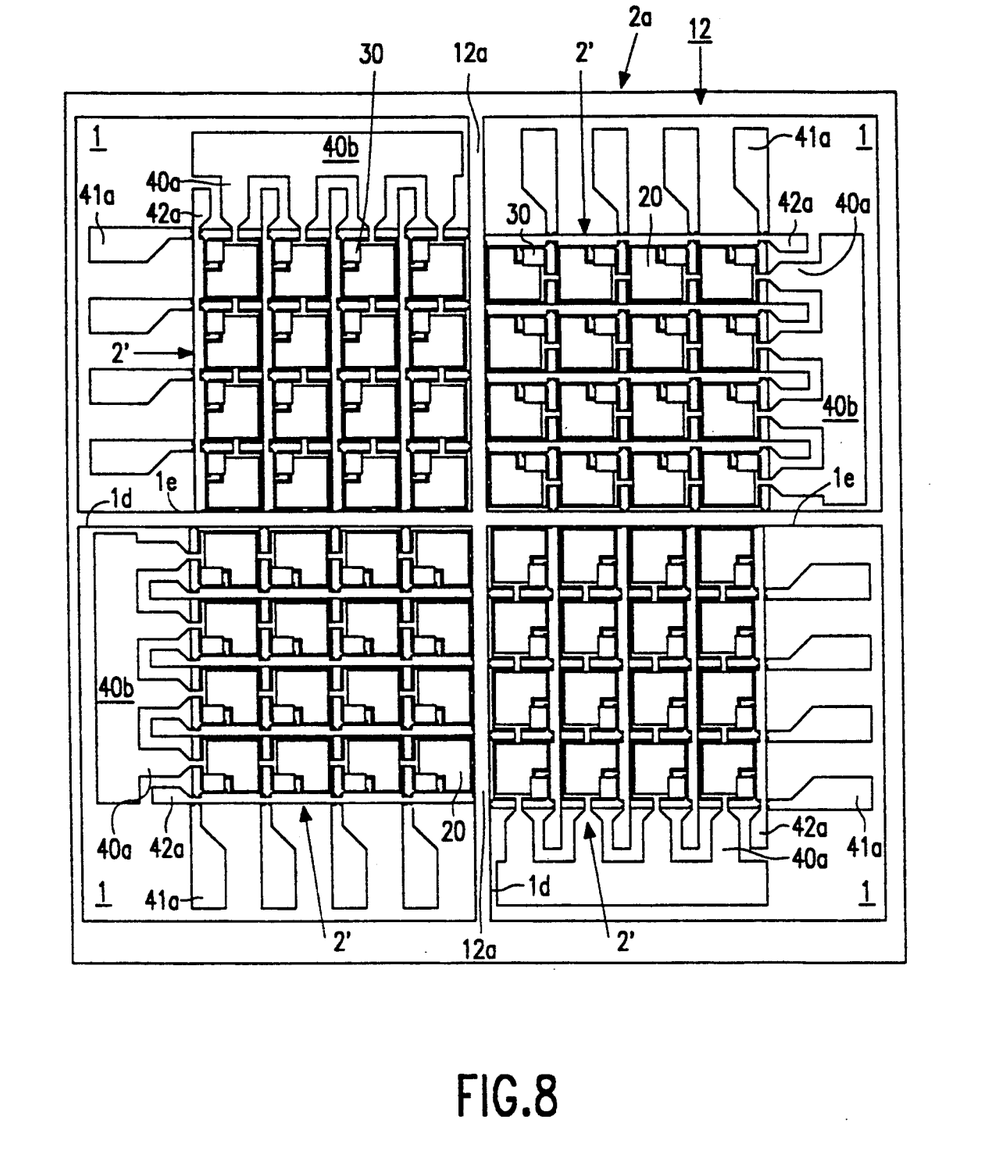
FIG. 8 is a schematic plan view showing another example of a large area active matrix array in accordance with the invention.

FIG. 8 illustrates a modified version 2a of the large area active matrix array in which, as in the example illustrated in FIG. 6, four substrates 1 are mounted to the support 12 so that the pixel pitch is maintained across the substrates. Again, in the interests of clarity the gaps 12a between the substrates 1 are shown enlarged in FIG. 8. The substrates 1 are the same as the substrates in the example shown in FIG. 6 but, after removal of the substrate portions 1a, the substrates are rotated through 90° with respect to one another before being mounted on the support 12. This means that there need not be a row or column conductor 41 or 42 adjacent the new cut substrate edges 1d,1e and so reduces the required accuracy of the formation of the new substrate 1d,1e to about 20 μm. This is a considerable advantage because an accuracy of 20 μm in the cutting of the substrates may be easily obtained and polishing should not be necessary. A high yield of correctly functioning devices in which the pixel pitch is maintained across the entire large area active matrix array 2 should thus be obtained. As shown in FIG. 8, alternate sets of row and column connecting leads 41a,42a extend along each edge of the large area active matrix array 2a. Accordingly, suitable processing equipment, for example the use of a frame store arrangement and appropriate image rotation will be necessary for compatibility of the array 2a with display equipment although, of course, the array 2a may be used without such processing equipment if it is used in conjunction with, for example, a similarly addressed active matrix display device.

Figure 9:
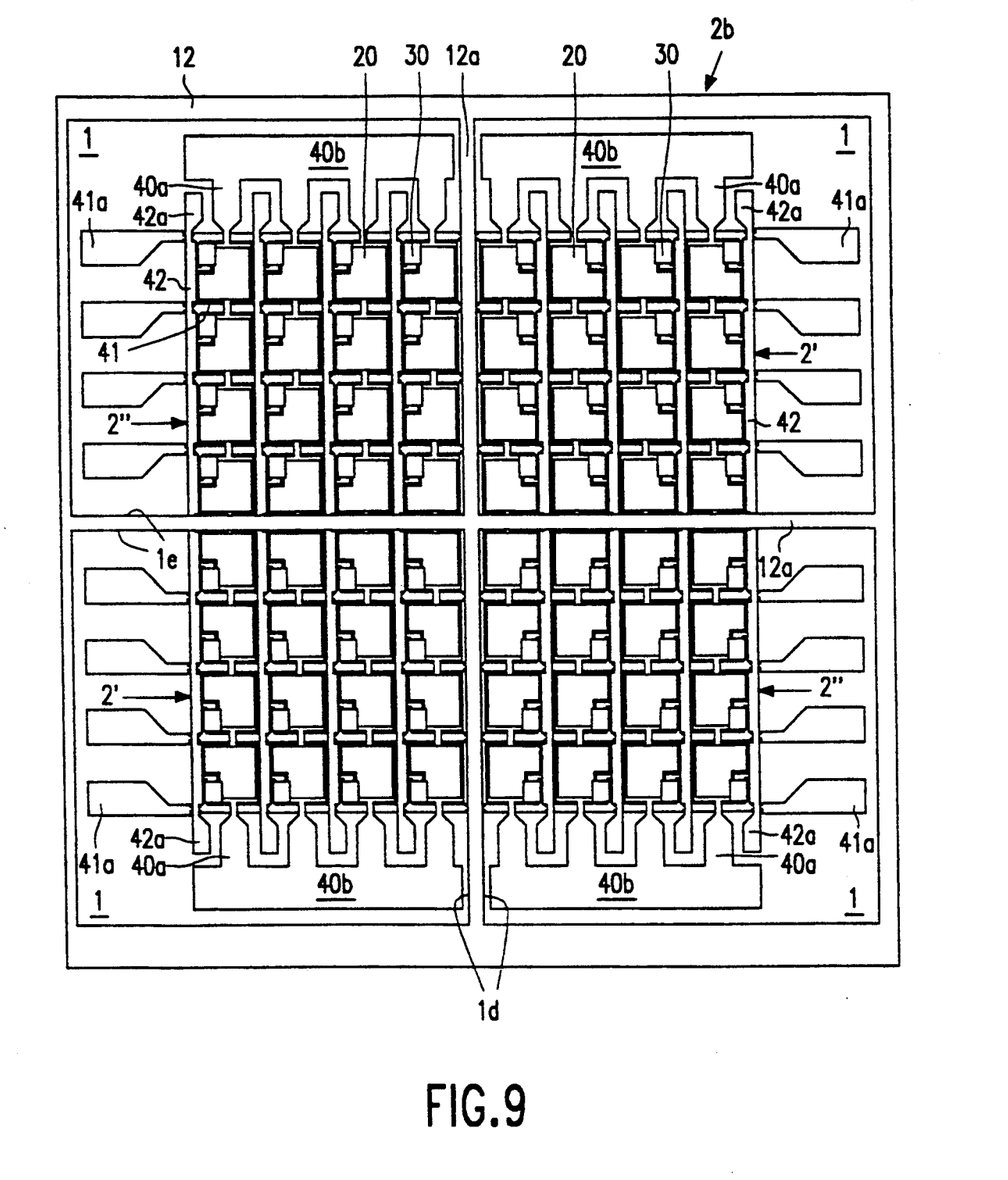
FIG. 9 is a schematic plan view showing a further example of a large area active matrix array in accordance with the invention.

A further example of a large area active matrix array 2b is shown in FIG. 9. Again, although in practice the four substrates 1 are mounted to the support 12 so as to maintain the same pixel pitch across the entire array 2b, the gaps 12a between the substrates 1 are shown enlarged in the interests of clarity. In this example the advantage of avoiding the need to have row or column conductors 41 or 42 adjacent the new substrate edges 1d,1e and the advantage of having only row connecting leads 41a or column correcting leads 42a along a given edge of the array 2 are combined. This is achieved by forming the sub-arrays 2 using two different mask sets one of which is a mirror image of the other, that is so that the switching element 30 is in a left hand corner of two of the sub-arrays 2' and in a right hand corner of the other two sub-arrays 2''. The four sub-arrays are then arranged on the support 12 so that one of each pair of two identical substrates is rotated through 180° with respect to the other as shown in FIG. 9.

The large area image sensor arrays shown in FIGS. 6 to 9 may be used in X-ray detectors as described above in combination with an electromagnetic radiation conversion layer 50.

The energy conversion layer may be provided directly onto the large area active matrix array 2, 2a or 2b formed by the four sub-arrays 2', 2'' already mounted on the support 12. Where the energy conversion layer to be used is electrically conductive or semiconductive, for example where a thallium-doped caesium iodide phosphor layer is used, then a protective insulating layer 51 (indicated in phantom lines in FIG. 4G) transparent to the converted electromagnetic radiation R will be provided over each sub-array 2' before the portions 1a of the substrates 1 are removed. The provision of such a protective insulating layer 51 has the added advantage of protecting the sub-array 2' during the cutting process to remove the portions 1a and indeed the protective layer 51 could be provided for this purpose even when an energy conversion layer is not subsequently provided on top. The insulating layer 51 could of course alternatively be provided after connecting of the substrates 1 on the support 12. The insulating layer should be sufficiently thick, typically greater than 3 $\mu$n (micrometers), to reduce capacitive coupling between the energy conversion layer 50 (FIG. 1) and the array 2. As an alternative, the energy conversion layer 50 may be provided on a separate substrate, for example an aluminium substrate, which is then mounted to the array 2 in the manner described in our copending UK Application No. 9115259.5 filed on 15 Jul., 1991 (our reference PHB33729).

As one possible alternative, a large area active matrix array 2 manufactured in accordance with the invention may be used without the electromagnetic radiation conversion layer 50 where the radiation to be detected lies within the range to which the photodiodes are sensitive. In such a case, if the substrates 1 and support 12 are transparent to the radiation to be detected and the array 2 can transmit a reasonable proportion of the radiation incident on the support 12, that is if, for example, at least about 40% of the area of each pixel is transparent to the radiation, the array 2 may be used in a reflection type imager or document copier such as a facsimile machine. In such a device, a special protective layer may directly cover the array 2 of photosensitive elements 20 and associated switching elements 30. The protective layer is arranged to be transparent to electromagnetic radiation detectable by the photosensitive elements 20 and provides a surface onto which an object, such as a document, may be placed so that the document is in intimate contact with the image detector which then detects radiation reflected by the document. Such a protective layer, like the layer 51 shown in phantom lines in FIG. 4G, will generally be provided on the substrates 1 before removal of the portions 1a so as to protect the substrates 1 during the cutting process but could be provided after the substrates have been mounted onto the support 12. The protective layer may be formed of any suitable electrically insulating material, for example a polyimide, silicon dioxide or silicon nitride. Where a polyimide or similar flowable then settable layer is used to form the protective layer then it may provide additional advantages in planarising the surface to provide a flat surface onto which the document to be imaged can be placed. This may assist in reducing possible distortions in the image.

The protective layer inhibits mechanical damage of the image detector and also provides a barrier to moisture in the document which might otherwise cause parasitic leakage currents. Such an image detector enables true contact images to be formed and stored without the need for the use of lenses or light guiding arrangements while the use of a two dimensional array sensor has the advantage of enabling a two dimensional image to be produced at high operating speeds without the need for any mechanical components.

Although the photosensitivity of the switching elements 30 is not, especially where the switching elements are thin-film transistors with an inverted staggered structure, considered to be sufficiently large to constitute a problem, if necessary a mask layer, similar to those already used in liquid crystal displays, may be provided to shield the switching elements 30 from the incident radiation R.

Other types of switching elements may be used, for example although the embodiments described above show inverted staggered thin-film transistors, non-staggered thin-film transistors may be used. Also photosensitive elements other than n-i-p diodes can be used. Thus, for example p-i-n diodes (that is where the p conductivity layer is adjacent the first electrode 21) may be used. The use of n-i-p diodes is, however, preferred as they have a greater quantum efficiency that p-i-n diodes. As other alternatives, photosensitive Schottky diodes or photosensitive resistors could be used.

Although in the examples described above the large area active matrix array 2, 2a or 2b comprises a matrix array of photosensitive devices, the array could, for example, form part of a liquid crystal display (LCD) device. In such a case, each of the four substrates will carry a sub-array consisting of the switching elements and associated row and column conductors of the active matrix addressing system for the device. After the substrates have been mounted to the support in a manner similar to those described above to complete the array, the liquid crystal material is applied to the completed array using an appropriate conventional technique and then the other transparent, generally indium tin oxide, electrode may be provided on top of the liquid crystal layer to complete the liquid crystal display device. Of course, the present invention may be used to form an LCD device in which photosensitive elements, similar to those described above, are integrated within the LCD device.

From reading the present disclosure, other modifications and variations will be apparent to persons skilled in the art. Such modifications and variations may involve other features which are already known in the art and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

We claim:

1. A method of manufacturing a large area active matrix array, which method comprises providing four substrates each carrying an active area comprising a matrix of switching elements arranged in rows extending between first and second edges of the active area and columns extending between third and fourth edges of the active area and means for accessing individual switching elements comprising a respective row conductor connecting the switching elements of each row and terminating in connecting leads extending beyond the first and second edges of the active area and a respective column conductor connecting the switching elements of each column and terminating in connecting leads extending beyond the third and fourth edges of the active area, removing a portion of each substrate and the connecting leads carried thereby so as to form a new substrate edge adjacent each of two adjoining edges of the active area and mounting the substrates onto a support so that each new substrate edge is adjacent another new substrate edge to form the large area array.

2. A method according to claim 1, further comprising providing the substrates so that each array is identical and mounting the substrates to the support so that all of the substrates have the same orientation on the support.

3. A method according to claim 1, further comprising providing the substrates so that each array is identical and mounting the substrates to the support so that each substrate is rotated by 90° relative to the adjacent substrate.

4. A method according to claim 1, further comprising providing the substrates so that the arrays on two of the substrates are a mirror image of the arrays on the two other substrates and mounting the substrates to the support so that the remaining row conductor connecting leads extend along two sides of the support and the remaining column conductor connecting leads extend along the other two sides of the support.

5. A method according to claim 1, 2, 3 or 4, further comprising providing each substrate with an active area comprising a matrix of photosensitive elements each associated with a respective switching element.

6. A method according to claim 1, 2, 3 or 4, further comprising providing an electromagnetic radiation conversion layer on the array formed by the four substrates.

7. A large area active matrix array, which array comprises a support on which are mounted four substrates each carrying an active area comprising a matrix of switching elements arranged in rows extending between first and second edges of the active area and columns extending between third and fourth edges of the active area and means for accessing individual switching elements comprising a respective row conductor connecting the switching elements of each row and terminating in connecting leads extending beyond the active area and a respective column conductor connecting the switching elements of each column and terminating in connecting leads extending beyond the active area, a portion of each substrate and the connecting leads carried thereby having been removed so as to define a substrate edge adjacent each of two adjoining edges of the active area and the substrates being mounted to the support so that the substrate edges adjacent the two adjoining edges of the active area are adjacent one another to provide a large area array having the same pitch as each matrix.

8. An array according to claim 7, wherein each array is identical and all of the substrates have the same orientation on the support.

9. An array according to claim 7, wherein each array is identical and each substrate is rotated by 90° relative to the adjacent substrate.

10. An array according to claim 7, wherein the arrays on two of the substrates are a mirror image of the arrays on the two other substrates and the substrates are mounted to the support so that the remaining row conductor connecting leads extend along two sides of the support and the remaining column conductor connecting leads extend along the other two sides of the support.

11. An array according to claim 7, 8, 9 or 10, wherein each substrate has an active area comprising a matrix of photosensitive elements each associated with a respective switching element.

12. An array according to claim 7, 8, 9 or 10, wherein an electromagnetic radiation conversion layer is provided on the array formed by the four substrates.

* * * * *